(12) United States Patent
Chen et al.

(10) Patent No.: US 9,689,065 B2
(45) Date of Patent: *Jun. 27, 2017

(54) MAGNETIC STACK INCLUDING CRYSTALLIZED SEGREGANT INDUCED COLUMNAR MAGNETIC RECORDING LAYER

(71) Applicant: Seagate Technology LLC, Cupertino, CA (US)

(72) Inventors: Jingsheng Chen, Singapore (SG); Kaifeng Dong, Singapore (SG); Ganping Ju, Pleasanton, CA (US); Yingguo Peng, San Ramon, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 48 days.

This patent is subject to a terminal disclaimer.

(21) Appl. No.: 14/577,641

(22) Filed: Dec. 19, 2014

(65) Prior Publication Data

US 2015/0194175 A1    Jul. 9, 2015

Related U.S. Application Data

(60) Provisional application No. 61/923,561, filed on Jan. 3, 2014.

(51) Int. Cl.

| | |
|---|---|
| *G11B 5/66* | (2006.01) |
| *C23C 14/06* | (2006.01) |
| *G11B 5/65* | (2006.01) |
| *G11B 5/73* | (2006.01) |
| *C23C 14/08* | (2006.01) |
| *C23C 14/16* | (2006.01) |
| *C23C 14/35* | (2006.01) |

(52) U.S. Cl.
CPC .......... *C23C 14/06* (2013.01); *C23C 14/0641* (2013.01); *C23C 14/083* (2013.01); *C23C 14/165* (2013.01); *C23C 14/352* (2013.01); *G11B 5/65* (2013.01); *G11B 5/7325* (2013.01)

(58) Field of Classification Search
CPC .......... G11B 5/65; G11B 5/8325; G11B 5/66; G11B 5/653; C23C 14/06; C23C 14/0641; C23C 14/083; C23C 14/165; C23C 14/352

See application file for complete search history.

(56) References Cited

U.S. PATENT DOCUMENTS

| | | | |
|---|---|---|---|
| 8,003,163 B2 | 8/2011 | Lee et al. | |
| 8,173,282 B1 * | 5/2012 | Sun | G11B 5/65 204/192.1 |

(Continued)

OTHER PUBLICATIONS

Varaprasad et al., "L10 Ordered FePt-Based Perpendicular Magnetic Recording Media for Heat-Assisted Magnetic Recording", IEEE Transactions vol. 49, Issue 2, 2013.

(Continued)

*Primary Examiner* — Holly Rickman
(74) *Attorney, Agent, or Firm* — Hollingsworth Davis, LLC

(57) ABSTRACT

A stack includes a substrate, a magnetic recording layer having a columnar structure, and an interlayer disposed between the substrate and the magnetic recording layer. The columnar structure includes magnetic grains separated by a crystalline segregant or a combination of crystalline and amorphous segregants.

25 Claims, 11 Drawing Sheets

(56) References Cited

U.S. PATENT DOCUMENTS

| | | | | |
|---|---|---|---|---|
| 8,404,370 B2* | 3/2013 | Sato | ............. | G11B 5/82 |
| | | | | 427/128 |
| 8,623,670 B1 | 1/2014 | Mosendz et al. | | |
| 9,368,142 B2* | 6/2016 | Chen | ............. | G11B 5/7325 |
| 2010/0165510 A1* | 7/2010 | Takahashi | ............. | G11B 5/65 |
| | | | | 360/135 |
| 2011/0235479 A1 | 9/2011 | Kanbe et al. | | |
| 2012/0300600 A1 | 11/2012 | Kanbe et al. | | |
| 2013/0170075 A1* | 7/2013 | Dai | ............. | G11B 5/65 |
| | | | | 360/244 |
| 2014/0093748 A1* | 4/2014 | Chen | ............. | G11B 5/7325 |
| | | | | 428/831 |
| 2015/0129415 A1* | 5/2015 | Maeda | ............. | G11B 5/851 |
| | | | | 204/192.15 |

OTHER PUBLICATIONS

Yang et al., "Columnar grain growth of FePt (L10) thin films", Journal of Applied Physics 111, 2012, pp. 07B720-1-07B720-3.
Chen et al., "Granular L10 FePt-X (X=C, TiO2, Ta2Og) (001) nanocomposite films with small grain size for high density magnetic recording", J. app. Phys. 105, 2009, 07B702.
Kryder et al., "Heat Assisted Magnetic Recording", Proceedings of the IEEE, vol. 96, No. 11, Nov. 2008, 26 pages.

* cited by examiner

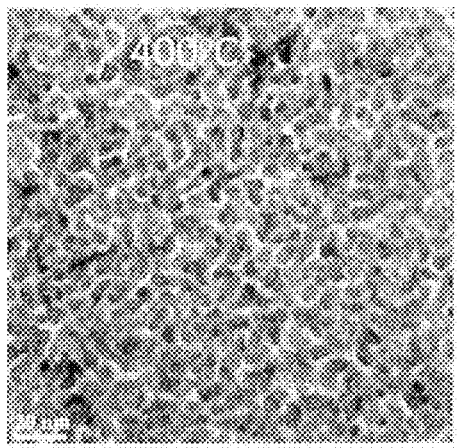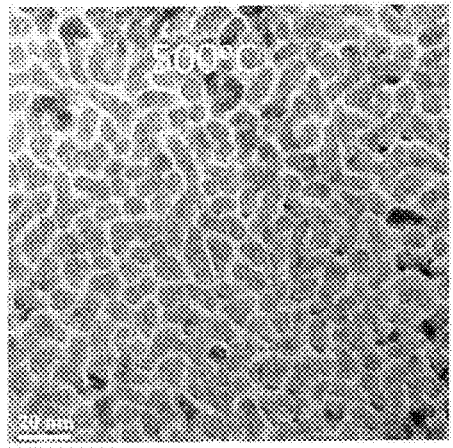
FIG. 3A        FIG. 3B
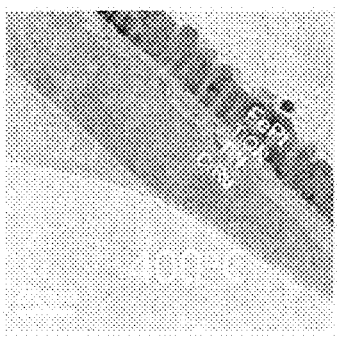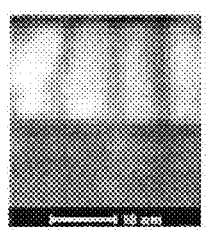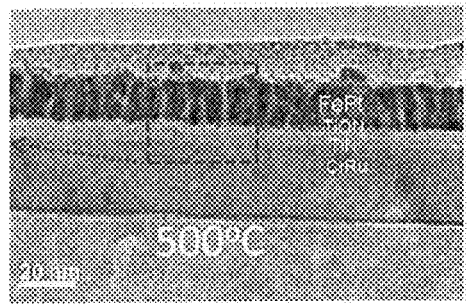
FIG. 4A        FIG. 4C        FIG. 4B

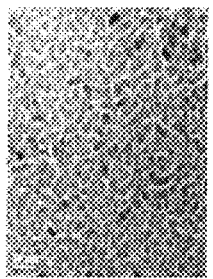 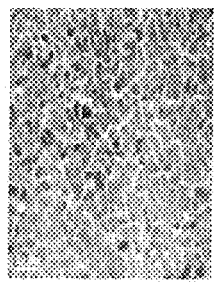 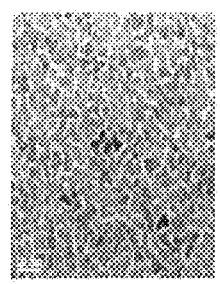 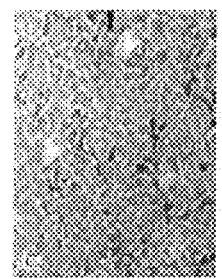
FIG. 10A  FIG. 10B  FIG. 10C  FIG. 10D
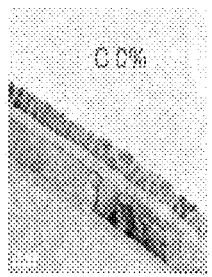 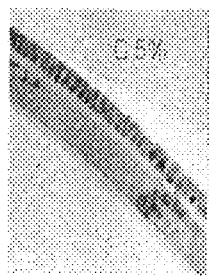 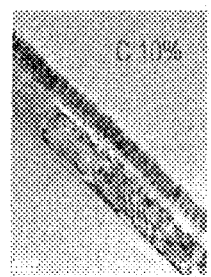 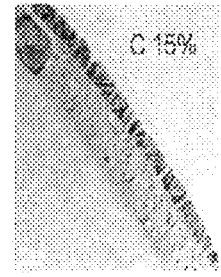
FIG. 11A  FIG. 11B  FIG. 11C  FIG. 11D

MAGNETIC STACK INCLUDING CRYSTALLIZED SEGREGANT INDUCED COLUMNAR MAGNETIC RECORDING LAYER

RELATED APPLICATIONS

This application claims the benefit of Provisional Patent Application Ser. No. 61/923,561 filed on Jan. 3, 2014, to which priority is claimed pursuant to 35 U.S.C. §119(e) and which is hereby incorporated herein by reference in its entirety.

SUMMARY

Embodiments discussed herein involve a stack that includes a substrate, a magnetic recording layer, and an interlayer disposed between the substrate and the magnetic recording layer. The magnetic recording layer has a columnar structure comprising magnetic grains separated by a crystalline segregant.

Additional embodiments are directed to a stack that includes a substrate, a magnetic recording layer having a columnar structure, and an interlayer disposed between the substrate and the magnetic recording layer. The magnetic recording layer comprises magnetic grains separated from each other by a crystalline segregant and by an amorphous segregant.

Further embodiments are directed to a method comprising forming an interlayer on a substrate and depositing a magnetic layer on the interlayer. The magnetic layer is deposited by sputtering a magnetic material and a segregant material, the sputtering forming columnar magnetic grains separated by a crystalline segregant.

BRIEF DESCRIPTION OF THE DRAWINGS

FIGS. 3A-B are TEM planar images of the FePt films of FIG. 2;

FIGS. 4A-C are TEM sectional images of the FePt films of FIG. 2;

FIGS. 10A-D are TEM planar images of the FePt films of FIG. 9;

FIGS. 11A-D are TEM sectional images of the FePt films of FIG. 9;

DETAILED DESCRIPTION

Heat assisted magnetic recording (HAMR) media has drawn attention due to the ability to extend areal density to 5 $Tb/in^2$, in theory, using, for example, the high magnetocrystalline anisotropy of FePt. Application of FePt thin films in heat assisted magnetic recording involves microstructures with small columnar grains to gain thermal stability and higher remanent magnetization ($M_r t$). These microstructures are used to achieve FePt films exhibiting good texture, large magnetocrystalline anisotropy, and small grain size with a narrow size distribution and well-isolated columnar structure. In order to achieve microstructures with these properties, FePt—C, FePt—$SiN_x$—C, FePt—$SiO_x$—C, FePt—Ag—C, et al. films with large magnetocrystalline anisotropy and small grain size have been fabricated. While doping with amorphous materials (e.g., C, $SiO_2$, $TiO_2$, etc.) obtains the requisite small grain size, the doped amorphous materials also easily diffuse to the magnetic recording layer surface. With the increase in desired media thickness (e.g., above 4-5 nm), for higher $M_r t$, the diffusion of the dopant materials at elevated sputtering temperatures results in a second nucleation of magnetic grains and the formation of a double layer structure. Therefore, magnetic grains of a magnetic recording layer are grown in a columnar shape with larger aspect ratios.

Embodiments discussed herein involve the use of crystalline doping, or segregant, materials in the magnetic recording layer. Crystalline segregants are materials maintaining crystalline structures at grain boundaries that are not changed by temperature. In contrast, amorphous segegrants are materials lacking a defined crystal structure and instead are defined by surface energy between the material and, for example, a magnetic grain boundary. Previous attempts to fabricate isolated columnar structural FePt films with (001) texture generated FePt films exhibiting poor perpendicular anisotropy. Instead, crystalline segregant materials have lower diffusion rates than those of amorphous segregant materials. For example, crystallized $ZrO_2$ is used to isolate FePt grains, and due to low diffusion rates of crystallized materials, FePt (001) films with columnar structure can be obtained. In certain embodiments, other crystallized doping materials such as $TiO_2$, TiC, and MgO, can be epitaxially grown on an interlayer to act as a segregant in the columnar growth of FePt grains in a recording layer. In further embodiments, additional segregant material, such as C, $SiO_2$, BN, Ag, etc., can enhance the magnetic grain isolation and stabilization.

Figure 1A:
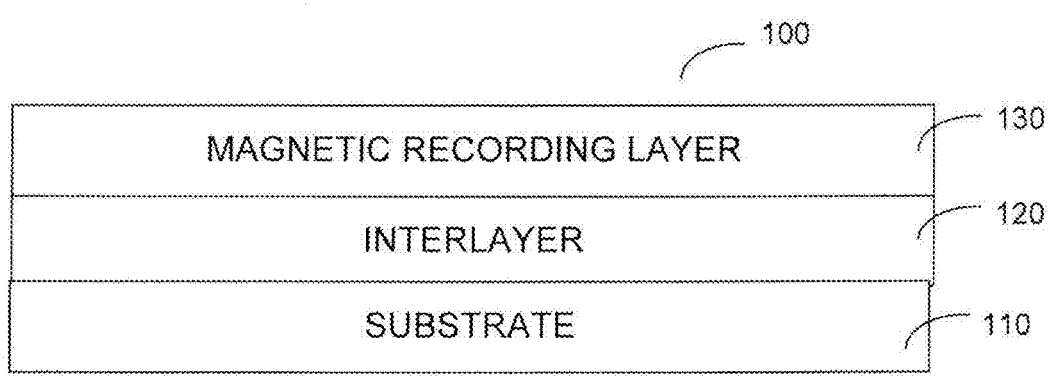
FIGS. 1A-B are cross-sectional diagrams of a magnetic stack in accordance with embodiments discussed herein.

FIG. 1A illustrates a magnetic stack 100 that includes a magnetic recording layer 130, as discussed above. The magnetic recording layer 130 overlies an interlayer 120 in the stack 100. As shown, the interlayer is disposed between a substrate 110 and the magnetic recording layer 130. The substrate 110 can comprise any variety of materials including, for example, silicon or glass.

According to various implementations, the interlayer 120 includes a TiN—X (002) layer. The TiN—X layer can comprise TiN and at least one doping material X, where X may comprise one or more of MgO, TiO, $TiO_2$, TiC, ZrN, ZrO, $ZrO_2$, ZrC, HfN, HfC, HfO, and $HfO_2$. In some cases, the dopant X may be a material for which the heat of formation of corresponding metallic nitrides at 298K is not less than 338 kJ/g-atom metal for TiN. In alternative implementations, the interlayer 120 includes an MgO—Y (002) layer. The MgO—Y layer can comprise MgO and at least one doping material Y, where Y may comprise one or more of Ni, Ti, Zr, etc. The non-magnetic segregant materials of the magnetic recording layer 130 are able to be epitaxially grown on the interlayer 120 since the interlayer 120 serves to orient and/or control the grain size of the magnetic recording layer 130. For example, one or more interlayers 120 promote the orientation of the magnetic layer epitaxial growth (e.g., FePt L10 (001) epitaxial growth), support granular two-phase growth of the magnetic recording layer 130, provide a specified amount of thermal conductivity, and/or may serve to block interdiffusion between the magnetic recording layer 130 and additional layers of the magnetic stack 100 on the opposing side of the interlayer 120.

Disposed upon the interlayer 120 is one or more magnetic recording layers 130. The magnetic recording layer 130 is a granular two-phase layer. The first phase of the magnetic recording layer 130 comprises magnetic grains and the second phase comprises non-magnetic segregant disposed between the grain boundaries of the magnetic grains. The non-magnetic segregant may comprise one or more of crystallized $ZrO_2$ and amorphous segregants like C, $SiO_2$, $Al_2O_3$, $Si_3N_4$, $TiO_2$, $WO_3$, $Ta_2O_5$, BN, or another alternative oxide, nitride, boride, or carbide material. Suitable materials for the magnetic grains include, for example FePt, FeXPt alloy, FeXPd alloy, and $Co_3Pt$. Although any of these materials in various combinations may be used for the magnetic layer 130, the examples provided herein focus on FePt as the magnetic recording layer magnetic grain material. The magnetic recording layer 130 can have a thickness ranging from about five to about thirty nanometers. Example microstructures for the magnetic recording layer 130 are further illustrated in FIGS. 1C-D.

Figure 1B:
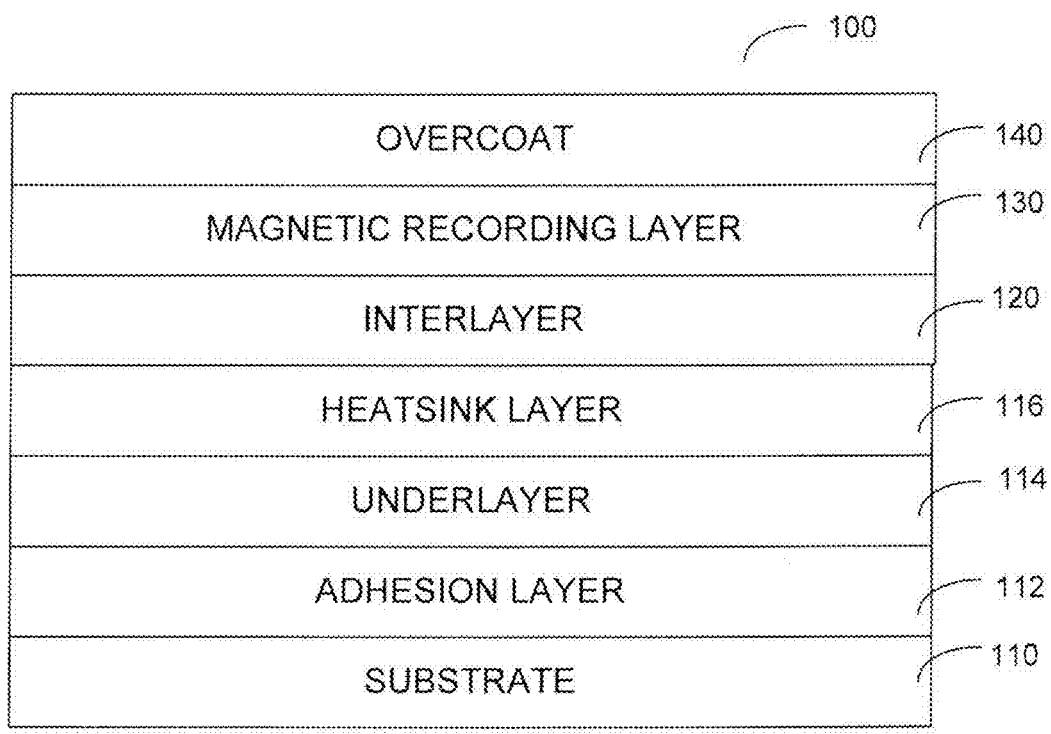

FIG. 1B illustrates a magnetic stack 100 including the layers of FIG. 1A along with additional, optional layers. For example, between the interlayer 120 and the substrate 110, the magnetic stack can include a heatsink layer 116. The heatsink layer 116 can comprise a variety of materials, e.g., one or more of Ag, Cu, Au, Al, Cr, Mo, W, etc. The magnetic stack 100 can also include one or more underlayers 114 between the interlayer 120 and the substrate 110. The one or more underlayers 114 can comprise a variety of materials, e.g., one or more of CrRu and MgO, and can function as a soft underlayer and/or a seed layer. An adhesion layer 112 may be disposed on the substrate 110, and a protective overcoat or lubricant layer 140 may be disposed on the magnetic recording layer 130. The microstructures of the magnetic recording layer 130 are further discussed below.

Figure 1C:
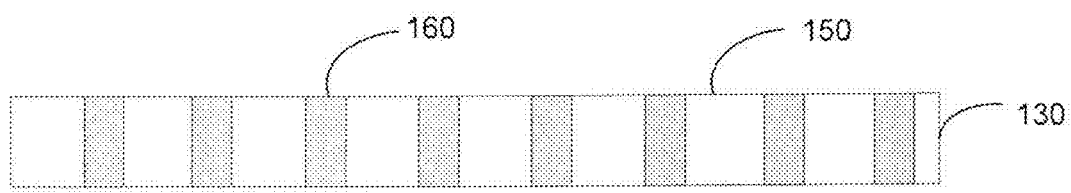
FIGS. 1C-D are cross-sectional diagrams of alternative magnetic recording layers of a magnetic stack in accordance with embodiments discussed herein.

FIG. 1C illustrates a magnetic recording layer 130 according to embodiments described further herein. The magnetic recording layer 130 includes magnetic grains 150 separated by non-magnetic segregant material 160. The magnetic grains 150 have a columnar structure influenced by the non-magnetic segregant material 160 being in crystallized, rather than amorphous, form. In various embodiments, the crystalline segregant comprises at least 50% crystalline structure of the doping material. In certain embodiments, the magnetic grains 150 are FePt and the segregant material 160 is $ZrO_2$. The composition of the magnetic recording layer can comprise a range of segregant concentrations, for example from 5 to about 50 vol. %. The segregant material 160 is epitaxially grown on the interlayer 120, similar to the magnetic grains 150, and the crystalline segregant materials 160 isolate the FePt grains 150. Due to lower diffusion rates of these crystalline segregant materials at elevated temperatures (as compared with the diffusion rates of amorphous materials), the segregant materials 160 do not diffuse to the magnetic recording layer 130 surface during deposition. Thus, the crystalline segregant materials 160 do not cause a second nucleation of FePt grains. Therefore, the columnar FePt grain microstructure can be obtained.

In an embodiment, $ZrO_2$ doped FePt films are grown on a TiON (002) layer. FePt—$ZrO_2$ films can be fabricated by co-sputtering of FePt and $ZrO_2$ targets or sputtering a composite FePt—$ZrO_2$ target using magnetron sputtering at an elevated substrate temperature (e.g., 400° C. or above) on the TiON layer. The crystallized FePt and $ZrO_2$ are dissoluble to each other; thus, columnar structural FePt films with (001) textures segregated with crystallized $ZrO_2$ at the FePt grain boundaries are obtained.

In a first medium structure, as illustrated in FIG. 1C, the FePt grains 150 are isolated by $ZrO_2$ crystallized segregant 160. The FePt—$ZrO_2$ based magnetic recording layer 130 is approximately 15 nm thick and grown on a (001) oriented fcc TiN—X layer 120. The magnetic recording layer 130 possesses perpendicular anisotropy due to epitaxial growth. The TiN—X interlayer 120 is formed on a CrRu or MgO based underlayer 114. A function of the TiN—X interlayer 120 is to block interdiffusion between underlayers 114 and the FePt magnetic recording layer 130 and to further tail the microstructure of the FePt magnetic recording layer 130.

Figure 1D:
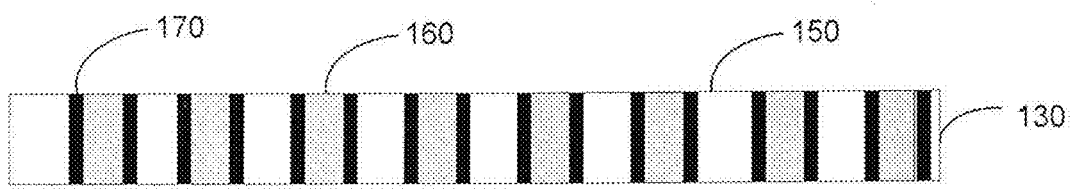

FIG. 1D illustrates a magnetic recording layer 130 according to additional embodiments described further herein. The magnetic recording layer 130 includes magnetic grains 150 separated by non-magnetic segregant material 160. The magnetic grains 150 have a columnar structure influenced by the non-magnetic segregant material 160 being in crystallized, rather than amorphous, form. In certain embodiments, the magnetic grains 150 are FePt and the segregant material 160 is $ZrO_2$. The segregant material 160 is epitaxially grown on the interlayer 120, similar to the magnetic grains 150, and the crystalline segregant materials 160 isolate the FePt grains 150. The composition of the magnetic recording layer can comprise a range of segregant concentrations, for example from 5 to about 50 vol. %. To enhance the perpendicular anisotropy of the magnetic recording layer 130 and enhance the isolation of FePt—$ZrO_2$ films, additional segregant materials 170 such as C, $SiO_2$, BN, Ag, etc. can be doped together with the $ZrO_2$. The additional segregant 170 forms columnar structures between the crystalline segregant material 160 and the magnetic grains 150 to isolate them from each other. This third material is an amorphous material which eases misalignment from the crystalline segregant material 160 to further stabilize the magnetic grains 150 in the magnetic recording layer 130. The composition of the magnetic recording layer can also comprise a range of amorphous segregant concentrations, for example from 5 to about 50 vol. %. For example, embodiments may comprise about 20-45 vol. % $ZrO_2$ and about 5-20 vol. % C. With the exception of the additional doping of a third, amorphous material, a magnetic recording layer 130, e.g., FePt—$ZrO_2ZrO_2$—C, can be fabricated with the same materials discussed above in connection with the FePt—$ZrO_2$ magnetic recording layer 130.

Magnetic recording layers having columnar microstructures as discussed above in both FIGS. 1C and 1D are further discussed below.

First, embodiments involving magnetic recording layer films having microstructures in accordance with those illustrated in FIG. 1C are described. For example, ten nanometer thick FePt-35 vol. % $ZrO_2$ films grown on respective TiN-40 vol. % $TiO_2$ layers were deposited on respective thirty nanometers thick underlayers comprising CrRu and respective glass substrates by co-sputtering FePt and $ZrO_2$ targets at a base pressure of $3\times10^{-9}$ Torr, respectively. The TiON (TiN doped by $TiO_2$) layer was fabricated by co-sputtering of TiN and $TiO_2$ targets in an anoxic circumstance in an ultra-high vacuum chamber at Ar pressure of 10 mTorr. In situ substrate heating during sputtering was used. The substrate temperatures for the CrRu underlayer, and TiON layer were 280° C. and 400° C. respectively. However, for the FePt—$ZrO_2$ layer, respective substrate temperatures of 400° C. and 500° C. were chosen.

The composition analyses of the films were determined by Energy dispersive X-Ray (EDX). The crystallographic structure and microstructure of the films discussed herein were measured by X-ray diffraction (XRD), scanning electron microscopy (SEM), and transmission electron microscopy (TEM). Magnetic properties were characterized at room temperature by a superconducting quantum interference device (SQUID) with a maximum applied field of 6 Tesla.

Figure 2:
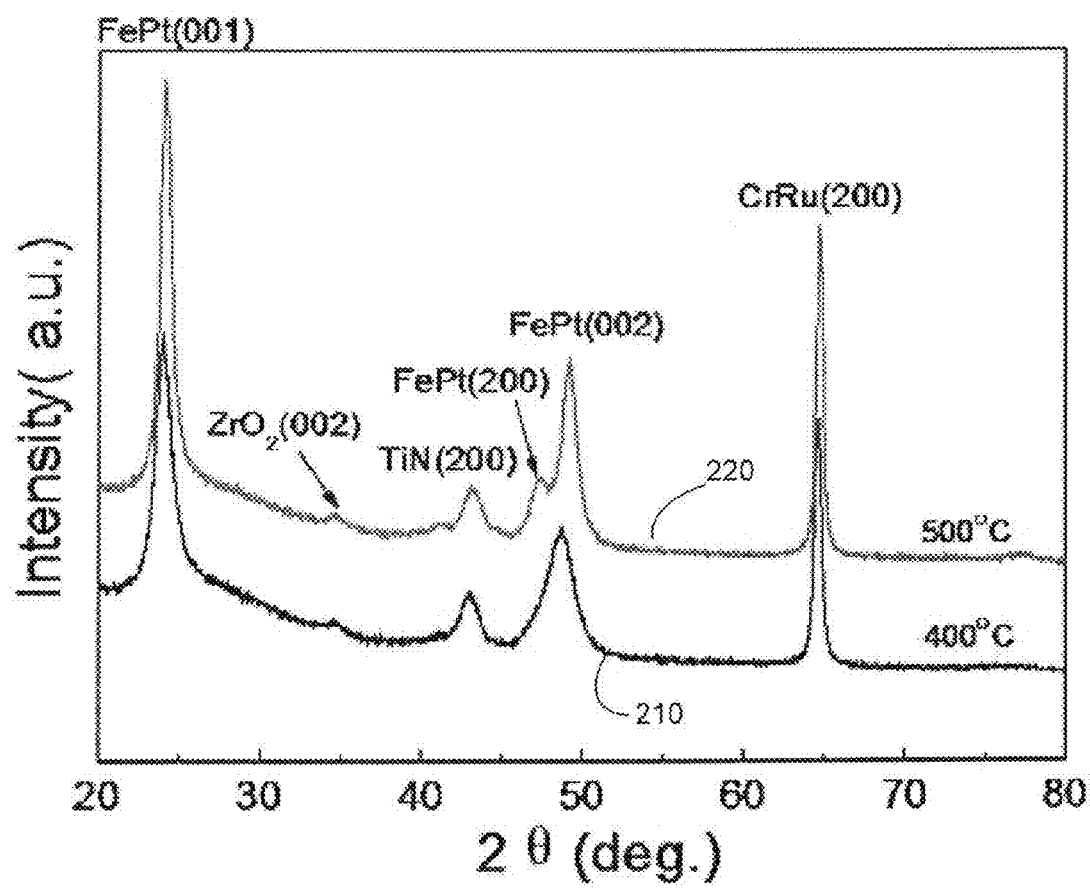
FIG. 2 shows XRD spectra of two FePt films grown on TiON layers with different sputtering temperatures.

FIG. 2 shows XRD spectra results for the two respective FePt—$ZrO_2$ films fabricated with differing sputtering temperatures on a TiON layer. The data labeled 210 represent the film sputtered at a temperature of 400° C. while the data labeled 220 represent the film sputtered at a temperature of 500° C. As can be seen, both FePt (10 nm)-35 vol. % $ZrO_2$ films 210, 220 exhibited good L10 (001) texture. Moreover, the $ZrO_2$ (002) peak at the position of 34.7° appeared, suggesting the $ZrO_2$ was crystallized at both high sputtering temperatures. However, with increasing sputtering temperature, a very clear FePt (200) peak appeared in 220, and the FePt (001) peak shifted slightly towards a higher angle in 220, indicating a reduced lattice constant and hence reduced TiN—X/FePt (001) lattice mismatch when sputtered at 500° C.

The granular microstructures of the respective FePt—$ZrO_2$ films fabricated with differing sputtering temperatures on a TiON layer discussed above are shown in FIGS. 3A-B and 4A-C. These microstructures are typical of those observed in a FePt—$ZrO_2$ system sputtered with a crystallized segregant material. FIG. 3A shows a planar view of the microstructures of the FePt 10 nm-$ZrO_2$ 35% film grown on a TiON layer at 400° C., while FIG. 3B shows the planar view of the FePt—$ZrO_2$ microstructures sputtered at 500° C. In both FIGS. 3A-B, the FePt particles indicate some interconnection in the planar direction. FIGS. 4A-B illustrate cross-sectional views of the films, where FIG. 4A is the TEM cross-sectional view of the film sputtered at 400° C. and FIG. 4B is the TEM cross-sectional view of the film sputtered at 500° C. FIG. 4C provides an enlarged view of the cross-sectional portion identified in FIG. 4B. While both FIGS. 4A-B show uniform columnar structure with a smooth surface, these properties are more pronounced for the FePt film with a sputtering temperature of 500° C. (FIG. 4B).

Figure 5:
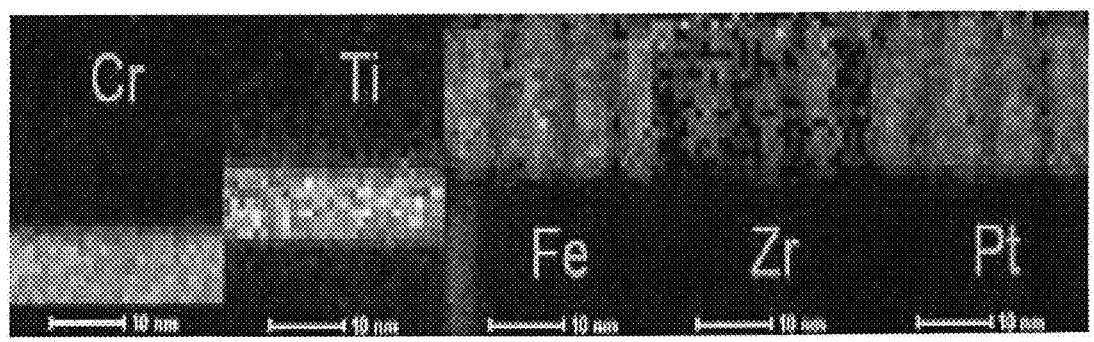
FIG. 5 is an EDX mapping analysis of the FePt film of FIG. 4B.

FIG. 5 illustrates an EDX mapping analysis of Cr, Ti, Fe, Zr, and Pt atoms in the FePt films grown on a TiON layer and a CrRu underlayer. As shown, Cr atoms are effectively blocked by the TiN layer, and Ti atoms are not diffused into the FePt—$ZrO_2$ magnetic recording layer. Furthermore, Zr atoms are almost distributed at the grain boundary of the FePt grains with columnar structure.

Figure 6:
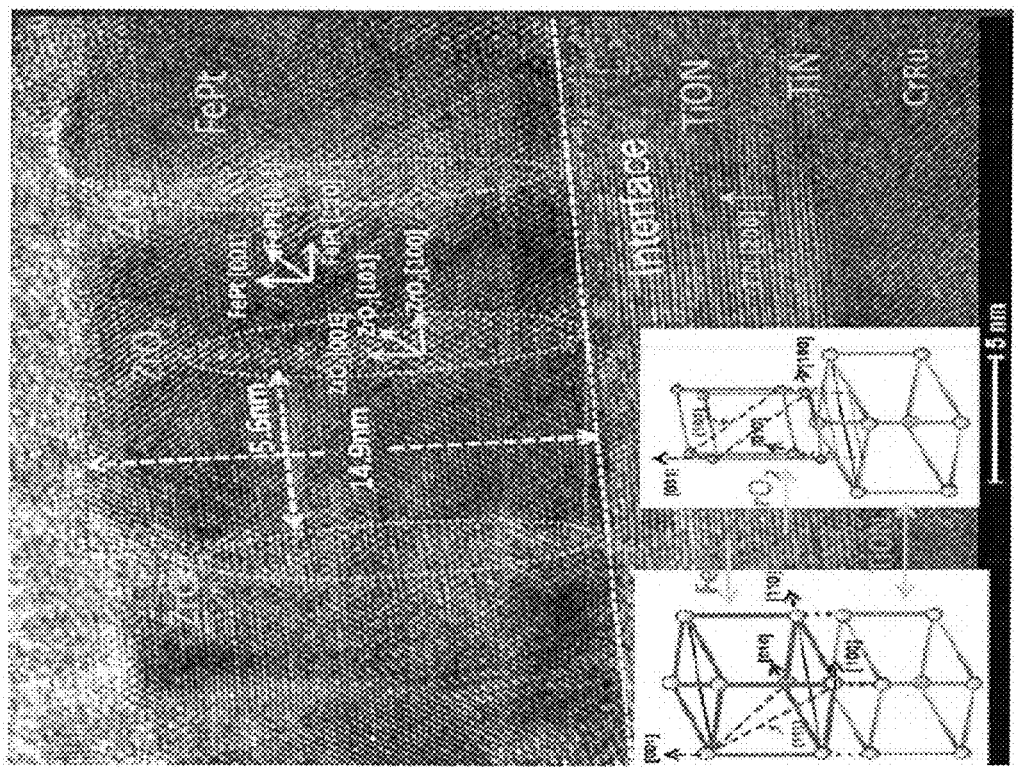
FIG. 6 is a high resolution TEM sectional image of a FePt film grown on a TiON layer at 500° C.

Further details of the orientation and dimensions of the columnar FePt grains grown on the TiON layer at a temperature of 500° C. are shown in the high resolution TEM image of FIG. 6. The columnar FePt grains with (001) orientation were epitaxially grown on the (200) textured TiON layer with an aspect ratio (height/diameter) of around 2.6. The areas outlined by ellipses indicate crystallized $ZrO_2$ located at the FePt grain column boundaries. Thus, tetragonal (002) textured $ZrO_2$ was formed on the (200) textured TiON layer, and distributed at the grain boundaries of FePt grains. As shown, FePt columnar grains were fabricated having a height of 6 to 20 nm and a width of 4 to 12 nm.

To further illustrate the orientation of the epitaxially grown FePt columnar grains and crystallized $ZrO_2$ segregant, FIG. 6 includes two insets. The inset on the left shows the unit cell of FePt on TiON and the inset on the right shows the unit cell of $ZrO_2$ on TiON. The left inset shows the FePt (001) plane arranged cubic-on-cubic on TiON (002) with FePt (001)<100>//TiON(001)<100>. The right inset shows that $ZrO_2$ unit cells are rotated about the [001] axis at about 45°, and the $ZrO_2$ (001) plane is arranged cubic-on-cubic on TiON (002) with $ZrO_2$ (001)<100>//TiON(001)<110. This crystalline orientation provides the columnar growth of the FePt grains. Materials satisfying these crystalline orientations/relationships enable favorable growth of taller columnar grains.

As is shown in FIG. 6, the interlayer includes a TiON layer disposed on a TiN layer, which is disposed on a CrRu underlayer. In some embodiments, a magnetic stack may include a doped TiN—X layer (e.g., TiON) and an undoped TiN layer. The undoped TiN layer is disposed between an underlayer and the TiN—X layer. In some configurations that use the TiN and TiN—X layers, the TiN layer may have a thickness of about 2 nm and the TiN—X layer may have a thickness of about 3 nm. The TiN—X layer may comprise a two phase granular layer having grains TiN—X and/or TiN grains and at least some of the X material is disposed at the grain boundaries of the TiN—X and/or TiN grains.

Figure 7A:
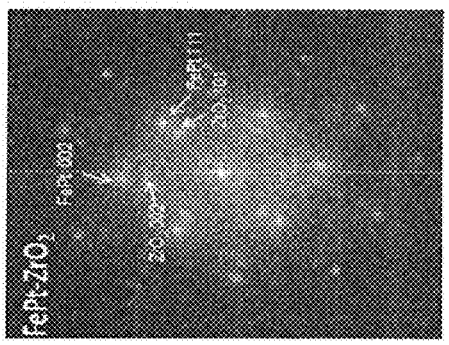
FIGS. 7A-B are selected area electron diffraction patterns for the respective layers of FIG. 6.
Figure 7B:
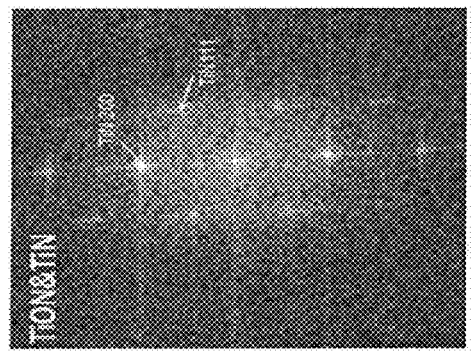

FIGS. 7A-B are selected area electron diffraction (SAED) patterns of the FePtZrO—$ZrO_2$ magnetic recording layer and the underlying interlayer. The SAED patterns of FePt—$ZrO_2$, shown in FIG. 7A, are composed of two sets of spots. One set belongs to FePt, such as (002) and (111). The other set belongs to $ZrO_2$, such as (002) and (101). The appearance of two sets of spots is the result of phase separation and the different lattice constant between FePt and $ZrO_2$. In FIG. 7B, TiON exhibits fcc (002) and (111) spots. As can be seen, the (002) axis of L10 FePt and (002) axis of $ZrO_2$ align very well along the TiN (002) axis, and the (111) axis of L10 FePt and (101) axis of $ZrO_2$ align along TiN (111) axis, respectively, confirming the epitaxial relationship of FePt (001) <100>//TiN (001)<200> and $ZrO_2$ (001)<100>//TiN (001) <110>. Therefore, FePt unit cells and $ZrO_2$ unit cells on TiON layer have the different arrangement shown in the left and right insets of FIG. 6.

Figure 8A:
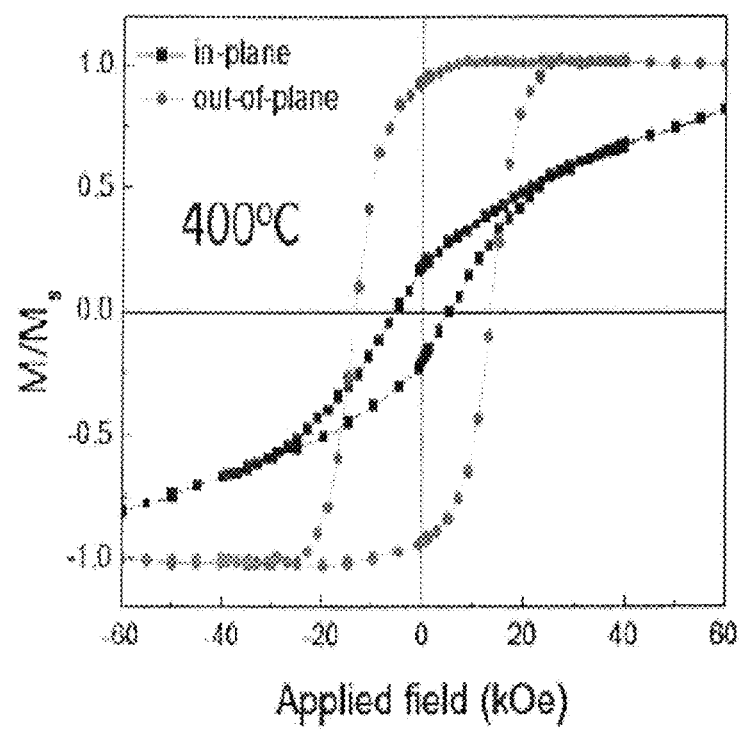
FIGS. 8A-B shows the in-plane and out-of-plane M-H loops of 10 nm FePt—$ZrO_2$ 35% films grown on TiON layers at different sputtering temperatures.
Figure 8B:
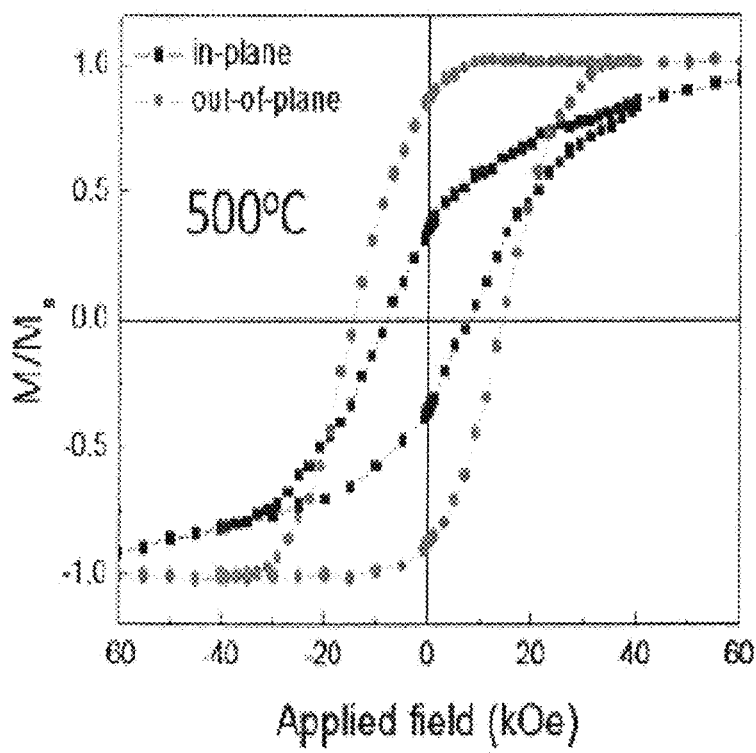

FIGS. 8A-B show the in-plane and out-of-plane M-H loops of 10 nm FePt—$ZrO_2$ 35% films grown on TiON layers at differing sputtering temperatures. FIG. 8A shows the M-H loops for a film deposited at 400° C. and FIG. 8B shows the M-H loops for a film deposited at 500° C. The loops of both figures show perpendicular anisotropy, however, the in-plane loops exhibit very large open-up, which is due to the existence of some FePt (200) phases. These results are consistent with the XRD results of FIG. 2. The out-of-plane and in-plane coercivity for FePt—$ZrO_2$ with 400° C. and 500° C. sputtering temperature were 13.5 kOe and 5.4 kOe, 14.2 kOe and 8.1 kOe, respectively. In general, films deposited with crystallized segregant have a coercivity in the range of 12 kOe.

Second, embodiments involving magnetic recording layer films having microstructures in accordance with those illustrated in FIG. 1D are described. For example, 8 nm thick FePt-35 vol. % $ZrO_2$—C films with different C doping concentrations (0, 5, 10, and 15 vol. %) were grown on a TiN-40 vol. % TiO$_2$ layer, which were deposited on 30 nm thick CrRu underlayers/glass substrates. The FePt—ZrO$_2$—C films were deposited by co-sputtering FePt, ZrO$_2$, and C targets at a base pressure $3\times10^{-9}$ Torr, respectively. The TiON (TiN doped by TiO$_2$) interlayer was fabricated by co-sputtering TiN and TiO$_2$ targets in an anoxic circumstance in an ultra-high vacuum chamber at Ar pressure of 10 mTorr. In situ substrate heating during sputtering was used. The substrate temperatures for CrRu, TiON and FePt—ZrO$_2$—C were 280° C., 400° C., and 500° C., respectively. Thus, the microstructures and magnetic properties of the FePt—ZrO$_2$—C films are comparable to those discussed above in connection with the FePt—ZrO$_2$ films deposited at 500° C.

Figure 9:
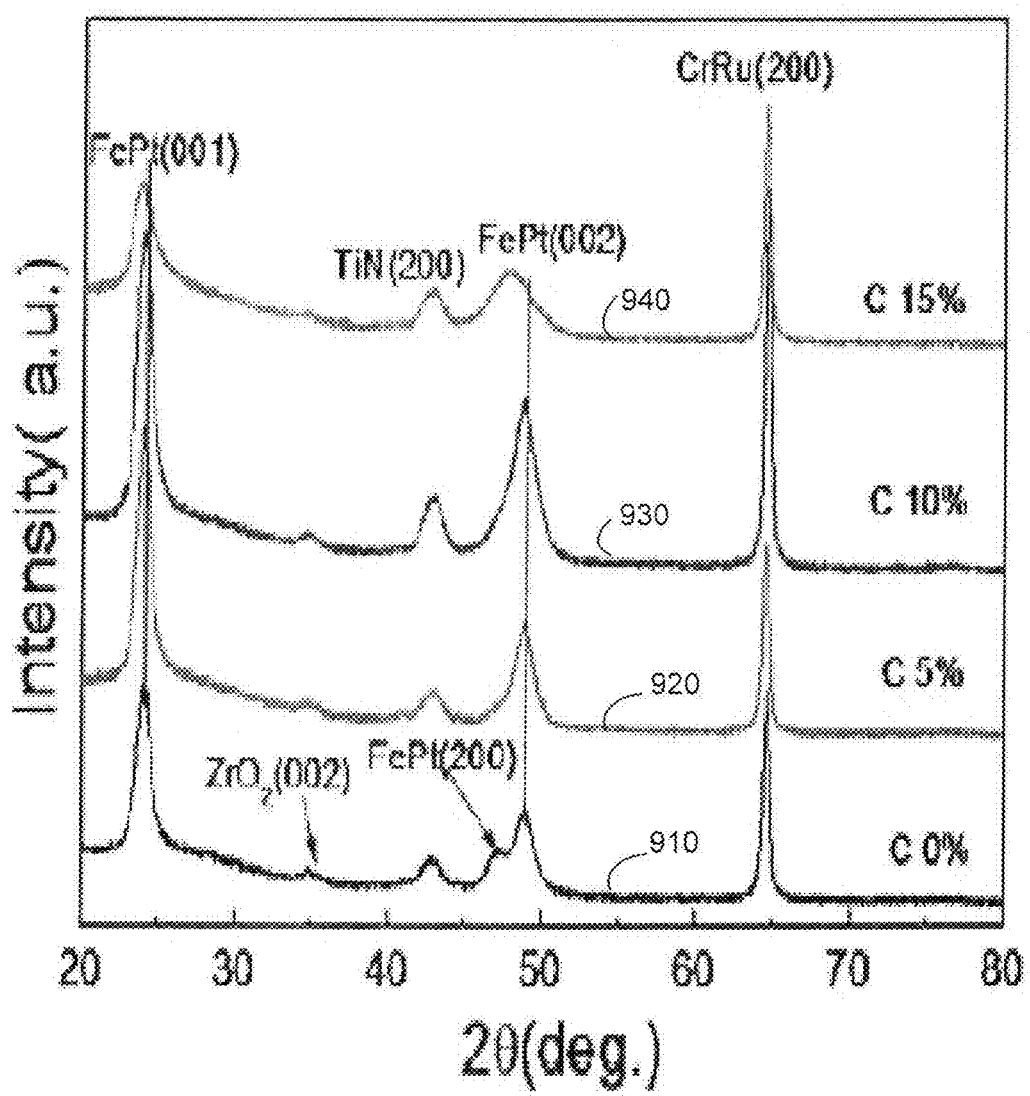
FIG. 9 shows XRD spectra of FePt films grown on TiON layers with different concentrations of C segregant.

FIG. 9 shows XRD spectra results for the respective FePt—ZrO$_2$—C films fabricated with differing C segregant concentrations on a TiON layer. The data labeled 910 represent the film with 0 vol. % C concentration; the data labeled 920 represent the film with 5 vol. % C concentration; the data labeled 930 represent the film with 10 vol. % C concentration; and the data labeled 940 represent the film with 15 vol. % C concentration. Without any C segregant (data 910) in the magnetic film, a very clear FePt (200) peak is shown. However, with 5 and 10 vol. % C doping into the FePt—ZrO$_2$ films (data 920 and 930, respectively), the FePt (200) peak disappears, indicating enhancement in the FePt (001) texture. Moreover, the position of the FePt (001) peak shifts to lower angles with increasing C segregant concentrations, indicating an increase in lattice constant with the increasing C concentration. With this position shift, the intensities of the FePt (001) and (002) peaks increased, and the ZrO$_2$ (002) peak was still present (see, e.g., 920, 930). Further increasing the C concentration to 15 vol. % decreases the intensity of the FePt (001) and (002) peaks and also broadens those peaks.

The granular microstructures of the respective FePt—ZrO$_2$—C films fabricated with differing C concentrations on a TiON layer discussed above are shown in FIGS. 10A-D and 11A-D. FIGS. 10A-D are TEM planar view images of 8 nm FePt—ZrO$_2$ 35%-C films grown on a TiON layer with differing concentrations of C segregant. The film of FIG. 10A has 0 vol. % C; the film of FIG. 10B has 5 vol. % C; the film of FIG. 10C has 10 vol. % C; and the film of FIG. 10D has 15 vol. % C. Each of the FIGS. 10A-D includes a scale of 20 nm. Similarly, FIGS. 11A-D are TEM cross-sectional view images of the films of FIGS. 10A-D, respectively. Thus, the film of FIG. 11A has 0 vol. % C; the film of FIG. 11B has 5 vol. % C; the film of FIG. 11C has 10 vol. % C; and the film of FIG. 11D has 15 vol. % C. Each of the FIGS. 11A-D includes a scale of 20 nm. Each of the images of FIGS. 10A-D and 11A-D show that the FePt—ZrO$_2$—C films exhibit columnar structural FePt grains grown on a TiON layer. However, in FIGS. 10A-D the FePt particles are interconnected in the planar directions. With C doping the columnar structure of FePt is enhanced. FIGS. 10B and 11B especially illustrate that for 5 vol. % C doped FePt—ZrO$_2$—C films, very good columnar structure is obtained. The columnar aspect ratio h/D (height/diameter) of the FePt grains grown is in a range of 1 to 2.6, and generally, around 2.

Figure 12A:
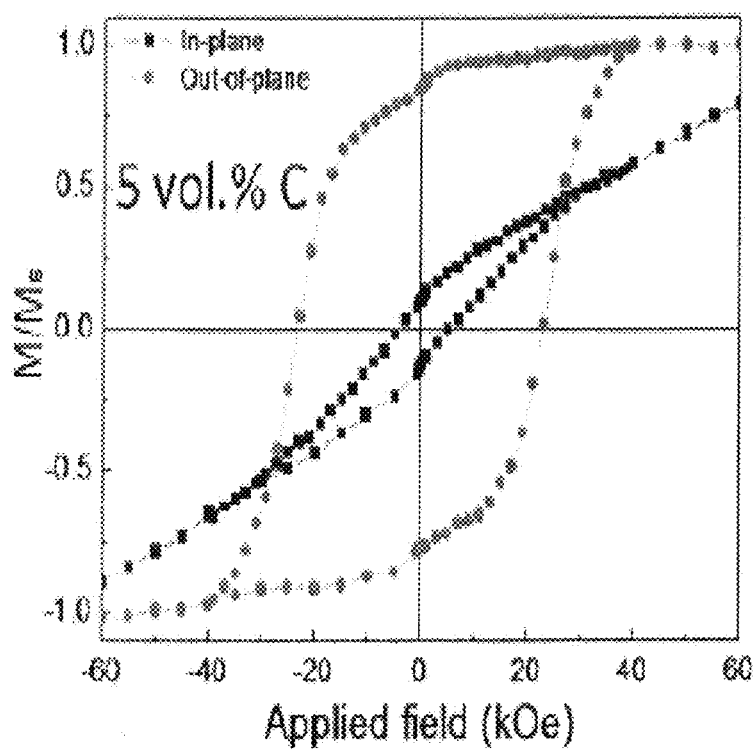
FIGS. 12A-B shows the in-plane and out-of-plane M-H loops of 8 nm FePt—$ZrO_2$ 35%-C films grown on TiON layers at different concentrations of C segregant.
Figure 12B:
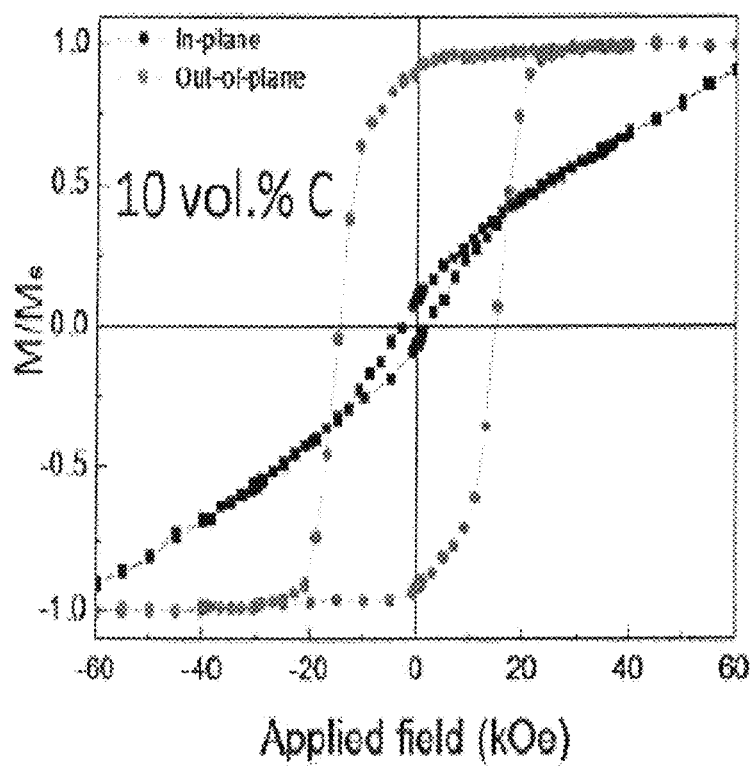

FIGS. 12A-B show the in-plane and out-of-plane M-H loops of 8 nm FePt—ZrO$_2$ 35%-C films grown on TiON layers with differing C concentrations. FIG. 12A shows the M-H loops for a film with 5 vol. % C, and FIG. 12B shows the M-H loops for a film deposited with 10 vol. % C. With C doping added to the FePt—ZrO$_2$ films, FePt—ZrO$_2$—C films of both FIGS. 12A-B show very good perpendicular anisotropy. Without the additional C segregant, FePt—ZrO$_2$ films exhibited inferior perpendicular anisotropy (e.g., as shown in FIGS. 8A-B). With 5 vol. % C doping, the perpendicular anisotropy is enhanced with an out-of-plane coercivity increase to 23.2 kOe and an in-plane coercivity decrease to 4.3 kOe. Further increasing C concentration to 10 vol. % causes a decrease for both out-of-plane coercivity (to 14.9 kOe) and in-plane coercivity (to 2.9 kOe). In general, films deposited with crystallized segregant and additional amorphous C segregant have coercivity in the range of 15 kOe.

According to various embodiments, this crystallized ZrO$_2$ doping induced columnar structural FePt based material can be used as a magnetic recording medium having a FePt L1$_0$ (001) textured film with very good columnar structure and increased perpendicular anisotropy. For example, a FePt—ZrO$_2$ film including additional 5 vol. % C segregant, the out-of-plane coercivity can reach about 23.2 kOe with a small in-plane coercivity of about 4.2 kOe. The columnar aspect ratio D/h of such FePt grains is around 2. In addition, the heat treatment of HAMR media benefit from the thermal conductivity of, for example, a TiN—X underlayer/interlayer in connection with the crystallized doped FePt—ZrO$_2$ films.

While various interlayer compositions may be used in connection with the above-described crystallized doped FePt—ZrO$_2$ films, embodiments involving FePt—ZrO$_2$ grown on a TiN—X underlayer/interlayer exhibit certain advantages over FePt—X (X=SiO$_2$ or TiO2) grown on a MgO underlayer/interlayer with columnar structure. Such advantages include larger perpendicular anisotropy, good columnar structure, enhanced granular microstructure, and conductivity. For example, a TiN—X layer provides enhanced FePt epitaxial growth and orientation control due to the wetting of TiN to FePt compared with non-wetting MgO. Also, the crystallized FePt and ZrO$_2$ are completely dissoluble to each other, and the driving force between FePt and ZrO$_2$ causes distinct phase separation. Thus, columnar structural FePt films with (001) textures segregated with crystallized ZrO$_2$ at the FePt grain boundaries are obtained. Moreover, the crystallizing process aggregates the ZrO$_2$ atoms and blocks the diffusion of ZrO$_2$ atoms into the surface of FePt thereby reducing the possibility of forming dual layer structures as compared with doping with amorphous materials. Further, TiN—X can be fabricated using DC-sputtering, which has higher deposition rates (throughput rate) and lower chamber contamination than the RF-sputtering of insulate MgO.

Figure 13:
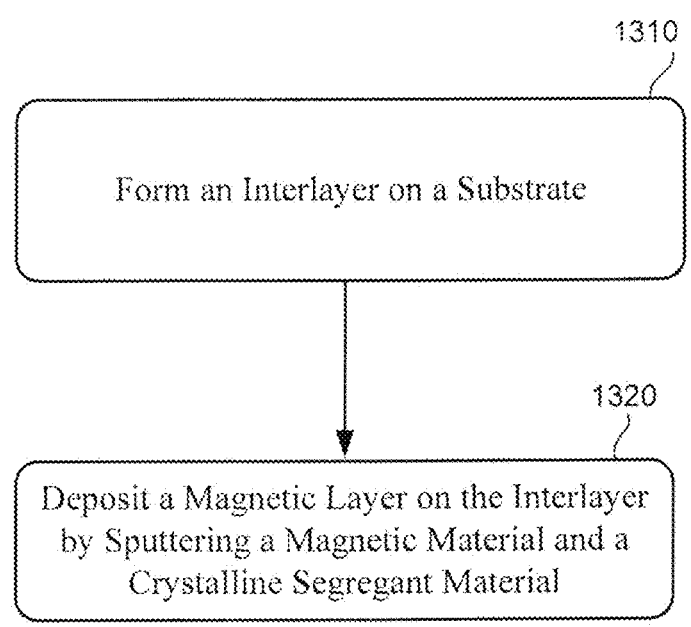
FIG. 13 is a flow diagram illustrating a process for depositing a columnar magnetic layer, according to various embodiments.

A magnetic stack comprising at least an interlayer and a magnetic recording layer, as discussed in the embodiments above, is produced as disclosed in the flow chart of FIG. 13. Prior to forming the interlayer, a substrate is processed and optional underlayers are applied such as an adhesion layer, an underlayer, and/or one or more heatsink layers. These are fabricated using standard techniques known in the art and are not discussed further. An interlayer is then formed on the substrate 1310. The interlayer can comprise a variety of materials such as MgO—Y and TiN—X, where Y and X are dopant materials.

In various embodiments, a TiN—X layer can be fabricated by DC-sputtering of a composite target or by co-deposition of TiN and at least one doping material selected from MgO, TiO, TiO$_2$, ZrN, ZrO, ZrO$_2$, HfN, HfO, HfO$_2$, AlN, and Al$_2$O$_3$ using magnetron sputtering at elevated substrate temperature (400° C. or above). The doping concentration can be varied from 0 to 40 vol. %. If more than 40 vol. % dopant is added, deterioration of the layer orientation would likely occur. Because the nitrides, carbides, and monoxides of three IV group elements Ti, Zr, and Hf are isomorphs with similar chemical and physical properties and completely soluble to each other, the final TiN—X is a solid solution of TiN and at least one of MgO, TiO, ZrN, ZrO, HfN, HfO, AlN, and $Al_2O_3$. The (001) oriented fcc structure of TiN—X is maintained to enable FePt (001) epitaxial growth in the magnetic recording layer. The surface properties of TiN—X modified by doping are more favorable for FePt granular growth and hence enhance the grain size reduction. If there is oxygen content in doping, a little oxide such as $TiO_2$, $ZrO_2$, $Al_2O_3$, and/or $HfO_2$ forms at grain boundaries of the columnar TiN—X layer to enhance grain isolation and therefore the exchange decoupling of FePt grains.

Microstructural control of FePt thin films is considered for FePt alloy with high magnetocrystalline anisotropy used in magnetic recording media. From a thermodynamic perspective, the intrinsic properties, i.e., surface property and lattice structure, of the layers underlying the magnetic recording layer play an important role in determining the microstructural properties such as grain size, texture and surface morphology of FePt thin films fabricated by epitaxial growth when combined with extrinsic methods, e.g., doping the magnetic material with non-magnetic materials and/or the adjustment of deposition parameters. However, some materials used in the underlying layers may not achieve optimal balance between the microstructural requirements for the growth of a granular FePt thin film: epitaxial growth (large surface energy and small mismatch) and island growth (small surface energy and large mismatch). Therefore, it can be helpful if the properties of the underlying layers are capable of being intrinsically modulated. For example, modulating the intrinsic properties of a TiN—X layer can be accomplished by varying the dopant X in the TiN—X layer. In the case of X being $TiO_2$ or $ZrO_2$, for example, variation of X may produce a TiN—X comprising $TiO_xN_y$ or $ZrTiO_xN_y$, respectively. Note that x and y may be constant through the TiN—X layer or may vary with distance through at least a portion of the TiN—X layer.

Next, a magnetic layer is deposited on the interlayer by sputtering a magnetic material and a segregant material such that columnar magnetic grains separated by a crystalline segregant are formed 1320. In various embodiments, the magnetic grains comprise FePt and the crystalline segregant material comprises $ZrO_2$. The magnetic layer can be fabricated by DC- or RF-sputtering of a composite target (e.g., FePt—$ZrO_2$) or by co-deposition of FePt and at least one crystalline doping material selected from $ZrO_2$, $TiO_2$, TiC, and MgO using magnetron sputtering at elevated substrate temperature (400° C. or above). While various sputtering techniques may also be used, DC-sputtering is preferred due to the higher deposition rates (throughput rates) achievable as compared with, e.g., RF-sputtering. DC-sputtering also results in lower chamber contamination. For the disclosed embodiments, RF-sputtering is not required. The amount of crystalline segregant in the composite target can vary and be determined by media design and targeted grain size. For example, the composite target includes at most 50 vol. % $ZrO_2$. The sputtering is performed at a base pressure of $3 \times 10^{-9}$ Torr in an Ar environment. In various embodiments, deposition of the magnetic layer further includes depositing additional amorphous segregant. The additional segregant can comprise one or more of C, $SiO_2$, $TiO_2$, $WO_3$, $Ta_2O_5$, BN, Ag, etc.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. A stack, comprising:
   a substrate;
   a magnetic recording layer having a columnar structure comprising magnetic grains separated by a crystalline segregant; and
   an interlayer disposed between the substrate and the magnetic recording layer, wherein the interlayer is a TiN—X layer and X is a dopant comprising at least one of MgO, TiC, TiO, $TiO_2$, ZrN, ZrC, ZrO, $ZrO_2$, HfN, HfC, HfO, and $HfO_2$.

2. The stack of claim 1, wherein the magnetic grains comprise FePt.

3. The stack of claim 1, wherein the crystalline segregant is at least one of MgO, $TiO_2$, $ZrO_2$, and TiC.

4. The stack of claim 1, wherein the crystalline segregant is $ZrO_2$.

5. The stack of claim 4, wherein the magnetic recording layer comprises $ZrO_2$ in an amount between about 5 and about 50 vol. %.

6. The stack of claim 1, wherein the crystalline segregant comprises at least 50% crystalline structure.

7. The stack of claim 1, wherein the magnetic recording layer further comprises an amorphous segregant disposed between the magnetic grains and the crystalline segregant.

8. The stack of claim 7, wherein the amorphous segregant is at least one of an oxide and a nitride.

9. The stack of claim 7, wherein the amorphous segregant is at least one of C, $SiO_2$, $TiO_2$, $WO_3$, $Ta_2O_5$, and BN.

10. A stack, comprising:
    a substrate;
    a magnetic recording layer having a columnar structure comprising magnetic grains separated by a crystalline segregant; and
    an interlayer disposed between the substrate and the magnetic recording layer, wherein the interlayer is a MgO—Y layer and Y is a dopant comprising at least one of Ni, Ti, and Zr.

11. The stack of claim 1, wherein a thickness of the magnetic recording layer is between about 5 and about 30 nm.

12. The stack of claim 2, wherein the FePt grains have a height/diameter aspect ratio of at least about 1.

13. The stack of claim 1, further comprising a heatsink layer comprising an alloy including at least one of Ag, Au, Cu, Al, Cr, Mo, and W, wherein the heatsink layer is disposed between the interlayer and the substrate.

14. The stack of claim 1, further comprising an underlayer comprising one or more of CrRu and MgO, wherein the underlayer is disposed between the interlayer and the substrate.

15. A stack, comprising:
    a substrate;
    a magnetic recording layer having a columnar structure, comprising magnetic grains separated from each other by a crystalline segregant and by an amorphous segregant, wherein the magnetic grains comprise FePt, the crystalline segregant comprises $ZrO_2$, and the amorphous segregant comprises C; and an interlayer disposed between the substrate and the magnetic recording layer.

16. The stack of claim 15, wherein the magnetic layer comprises $ZrO_2$ in an amount between about 5 and about 50 vol. % and C in an amount of about 5-50 vol. %.

17. The stack of claim 15, wherein the magnetic layer comprises $ZrO_2$ in an amount between about 20 and about 45 vol. % and C in an amount of about 5-20 vol. %.

18. The stack of claim 15, wherein the magnetic grains comprise FePt having a height/diameter aspect ratio of at least 1.

19. A method, comprising:
forming an interlayer on a substrate, wherein the interlayer is a TiN—X layer and X is a dopant comprising at least one of MgO, TiC, TiO, $TiO_2$, ZrN, ZrC, ZrO, $ZrO_2$, HfN, HfC, HfO, and $HfO_2$; and depositing a magnetic layer on the interlayer by sputtering a magnetic material and a segregant material, the sputtering forming columnar magnetic grains separated by a crystalline segregant.

20. The method of claim 19, wherein the sputtering comprises co-sputtering FePt and $ZrO_2$, targets.

21. The method of claim 19, wherein the sputtering comprises sputtering a FePt—$ZrO_2$ composite target.

22. The method of claim 19, wherein depositing the magnetic layer further includes sputtering an amorphous material.

23. The method of claim 19, wherein depositing the magnetic layer comprises heating the substrate to temperature of at least 400 C.

24. The stack of claim 10, wherein the crystalline segregant is at least one of MgO, $TiO_2$, $ZrO_2$, and TiC.

25. The stack of claim 10, wherein the magnetic recording layer further comprises an amorphous segregant disposed between the magnetic grains and the crystalline segregant.

* * * * *

UNITED STATES PATENT AND TRADEMARK OFFICE
CERTIFICATE OF CORRECTION

PATENT NO. : 9,689,065 B2  
APPLICATION NO. : 14/577641  
DATED : June 27, 2017  
INVENTOR(S) : Jingsheng Chen et al.

Page 1 of 1

It is certified that error appears in the above-identified patent and that said Letters Patent is hereby corrected as shown below:

On the Title Page

(73) Assignee: SEAGATE TECHNOLOGY LLC, Cupertino, CA (US) should read -- NATIONAL UNIVERSITY OF SINGAPORE, Singapore (SG) --

Signed and Sealed this  
Eighth Day of August, 2017

Joseph Matal  
*Performing the Functions and Duties of the*  
*Under Secretary of Commerce for Intellectual Property and*  
*Director of the United States Patent and Trademark Office*